United States Patent [19]
Haukness

[11] Patent Number: 5,886,938
[45] Date of Patent: Mar. 23, 1999

[54] SEMICONDUCTOR MEMORY DEVICE HAVING SENSE AMPLIFIERS WITH OFFSET LATCH TRANSISTORS AND INTERLEAVED GATE FINGERS

[75] Inventor: Brent S. Haukness, Garland, Tex.

[73] Assignee: Texas Instruments Incorporated, Dallas, Tex.

[21] Appl. No.: 958,941

[22] Filed: Oct. 28, 1997

Related U.S. Application Data

[60] Provisional application No. 60/030,101 Oct. 31, 1996.
[51] Int. Cl.$^6$ ........................................... G11C 7/06
[52] U.S. Cl. .................. 365/205; 365/63; 327/57
[58] Field of Search ................. 365/205, 31, 52, 365/63, 72, 154; 257/368, 369, 390, 401; 327/55, 57

[56] References Cited

U.S. PATENT DOCUMENTS 5,317,178  5/1994  Wu ........................................... 365/156
5,644,525  7/1997  Takashima et al. ....................... 365/51

*Primary Examiner*—Tan T. Nguyen
*Attorney, Agent, or Firm*—Robby T. Holland; Carlton H. Hoel; Richard L. Donaldson

[57] ABSTRACT

A semiconductor memory device 10 having sense amplifiers where the latch transistor moat region width is increased for the same sense transistor pitch. Each sense amplifier comprises latch transistors having a moat region and a gate region comprising a plurality of gate fingers where the length of the gate fingers is determined by the pitch of the sense amplifier. Adjacent latch transistors are offset from one another in both the horizontal and vertical directions and the gate fingers of those latch transistors are interleaved such that the latch transistors have wider moat regions while maintaining the sense amplifier latch transistor pitch. The resulting structure increases the sensing performance while maintaining the pitch.

20 Claims, 3 Drawing Sheets

005,886,938

SEMICONDUCTOR MEMORY DEVICE HAVING SENSE AMPLIFIERS WITH OFFSET LATCH TRANSISTORS AND INTERLEAVED GATE FINGERS

This application claims priority under 35 USC § 119(e)(1) of provisional application Ser. No. 60/030,101, filed Oct. 31, 1996.

TECHNICAL FIELD OF THE INVENTION

The present invention relates generally to electronic circuits and more particularly, to a semiconductor memory device having sense amplifiers with offset latch transistors and interleaved gate fingers.

BACKGROUND OF THE INVENTION

Sense amplifiers are commonly used in semiconductor memory devices to sense and amplify a potential difference between paired bit lines. FIG. 1 shows a circuit diagram of the latch portion of a conventional sense amplifier, indicated generally at 4, formed by N-channel transistors $M_1$ and $M_2$ and P-channel transistors $M_3$ and $M_4$ where $N_1$ and $N_2$ are the paired bit lines, NC is the N-channel drive line, and PC is the P-channel drive line.

It is a generally desirable goal in semiconductor fabrication to reduce the size of semiconductor devices. This holds true for semiconductor memory devices such as Dynamic Random Access Memory (DRAM) devices. In a typical DRAM device, a sense amplifier must fit in the width of two bit line pairs which limits the sense amplifier width to four times the bit line pitch. This limitation on the pitch of sense amplifiers also limits the width of the sense amplifier latch transistors.

As the latch transistor width decreases, the sensing speed and performance of the sense amplifier also decreases. Thus, in a conventional memory device, the pitch of the memory bit lines limits the performance of the sense amplifiers by limiting the width of the latch transistors.

SUMMARY OF THE INVENTION

The present invention provides a semiconductor memory device having sense amplifiers with offset latch transistors and interleaved gate fingers that substantially reduces disadvantages and problems associated with previously developed sense amplifier structures.

In one aspect, the present invention provides a semiconductor memory device having sense amplifiers where the latch transistor moat region width is increased for the same sense transistor pitch. Each sense amplifier comprises latch transistors having a moat region and a gate region comprising a plurality of gate fingers where the maximum length of the gate fingers is a function of the pitch of the sense amplifier. Adjacent latch transistors are offset from one another in both the horizontal and vertical directions and the gate fingers of those latch transistors are interleaved such that the latch transistors have wider moat regions while maintaining the sense amplifier latch transistor pitch. The resulting structure increases the sensing performance while maintaining the pitch.

The present invention provides an important technical advantage by offsetting the latch transistors and interleaving the gate fingers in order to increase the width of the latch transistors without increasing the overall pitch of the sense amplifiers. The larger latch transistor width allows for increased sensing performance due to the wider latch transistor for a fixed sense amplifier pitch.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

The sense amplifiers of the present invention have offset latch transistors and interleaved gate fingers to allow a wider latch transistor for a fixed sense amplifier pitch. The wider latch transistor of the present invention increases the sensing speed of the sense amplifier for the fixed sense amplifier pitch.

Figure 1:
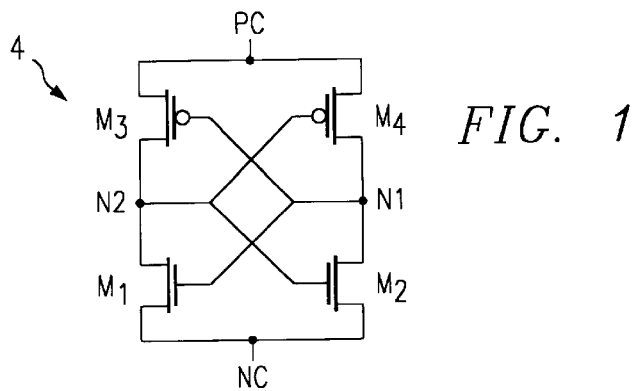
FIG. 1 shows a circuit diagram of the latch portion of a conventional sense amplifier.

FIG. 1, discussed above, shows a circuit diagram of the CMOS latch portion of a conventional sense amplifier 4 formed by two N-channel and two P-channel transistors. Sense amplifier 4 operates to sense charge on paired bit lines $N_1$ and $N_2$ and amplify the sensed voltage levels. The sense amplifier drive lines, NC and PC, are used to activate the latch. The associated equalization and output transistors are not shown in FIG. 1.

Figure 2:
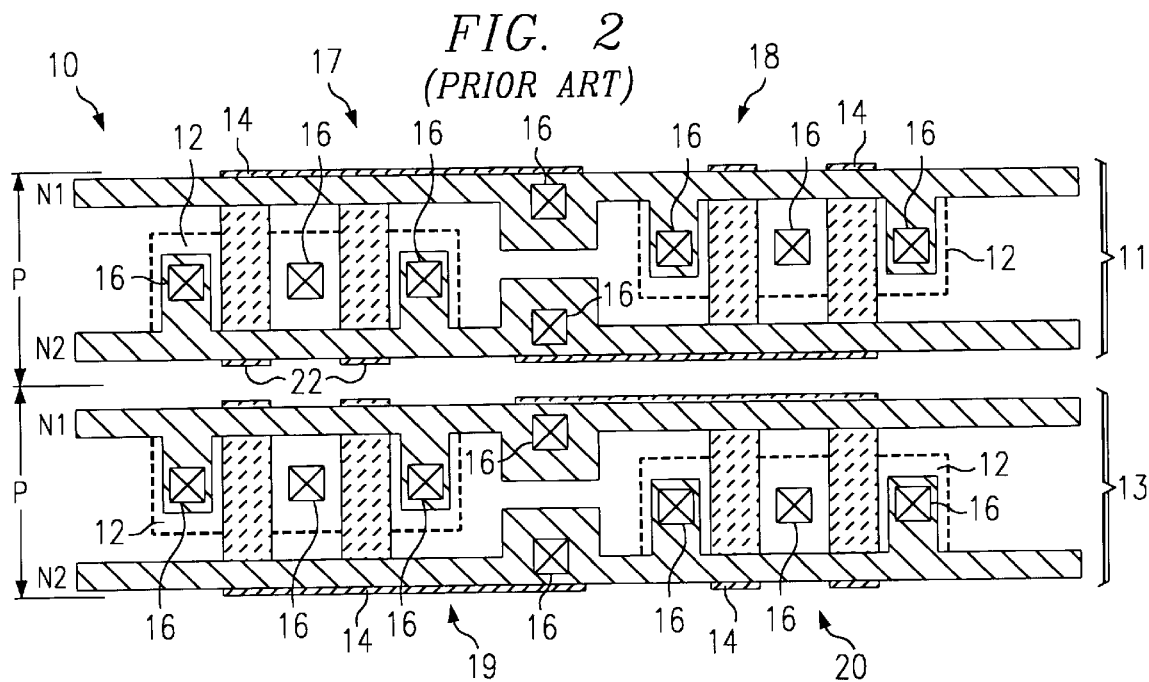
FIG. 2 shows a prior art layout of latch transistors in two adjacent sense amplifiers including connections to associated paired bit lines.

FIG. 2 shows a prior art layout of latch transistors in two adjacent sense amplifiers including connections to associated paired bit lines. The layout of the sense amplifier latch transistors can be identical for either N-channel or P-channel latch transistors, with only the implant and well levels different. FIG. 2 shows a semiconductor memory device, indicated generally at 10, that has sense amplifiers associated with paired bit lines in the memory array. Two adjacent sense amplifiers 11 and 13 have moat regions 12, gate regions 14, contacts 16, and paired bit lines N1 and N2 that form latch transistors 17, 18, 19 and 20. For each moat region 12, the middle contact 16 provides connection to the source, and the outside contacts 16 provide connection to the drain. The sense amplifiers 11 and 13 include an additional pair of latch transistors that are not shown to complete the circuit shown in FIG. 1. Typically, semiconductor memory device 10 would be fabricated comprising a plurality of sense amplifiers 11 and 13 associated with the paired bit lines of the memory array.

The sense amplifiers shown in FIG. 2 include latch transistors 17, 18, 19 and 20 that are aligned with one another. Consequently, the moat regions 12 and gate regions 14 are aligned including the gate fingers 22 of gate regions 14. As indicated earlier, the pitch, P, of sense amplifiers 11 and 12 is set by the memory cell size and limits the width of latch transistors 17, 18, 19 and 20.

Figure 3:
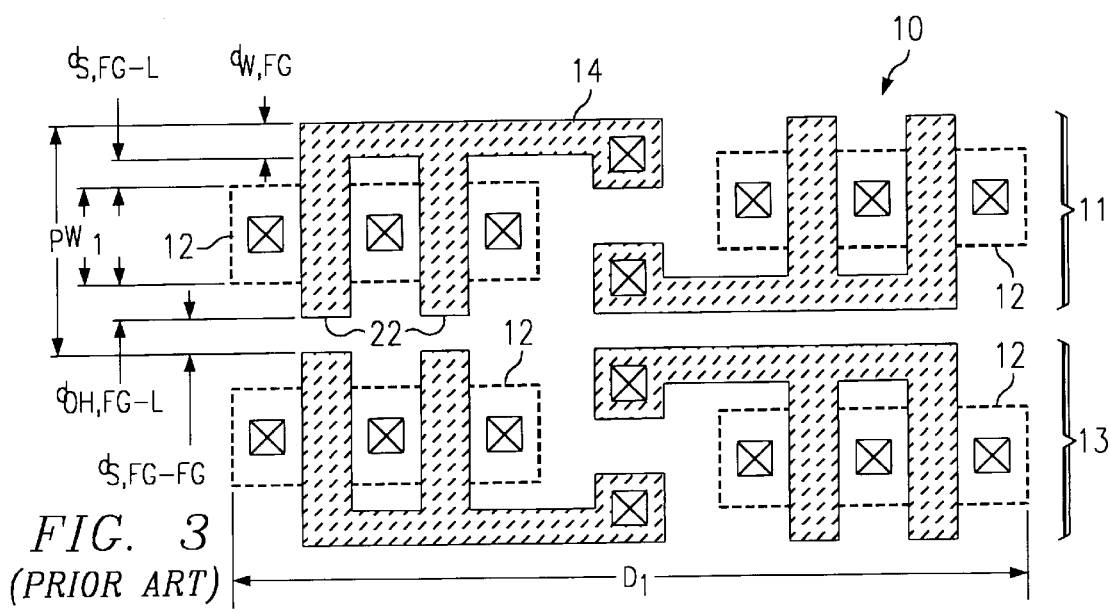
FIG. 3 shows the layout of the moats, gates, and contacts of the latch transistors in the sense amplifiers of FIG. 2.

FIG. 3 shows the layout of the moat regions 12, gate regions 14, and contacts 16 of the latch transistors 17, 18, 19 and 20 of FIG. 2. FIG. 3 illustrates the conventional layout of these regions, and further shows the sense amplifier pitch P and the latch transistor width $W_1$ which is the width of moat regions 12. In building the latch transistors 17, 18, 19 and 20, various design factors limit the latch transistor width $W_1$. Design rules for the fabrication process affecting latch transistor width $W_1$ include the minimum gate width ($d_{w, FG}$), the minimum gate to moat spacing ($d_{s, FG-L}$), the minimum gate overhang of moat ($d_{OH, FG-L}$), and the minimum gate-to-gate spacing ($d_{s, FG-FG}$). For a fixed sense amplifier pitch P, the widest latch transistor moat width $W_1$ for the latch transistors 17, 18, 19 and 20 of FIG. 3 is determined by:

$$W_1 = P - d_{s, FG-FG} - d_{w, FG} - d_{s, FG-L} - d_{OH, FG-L}.$$

As noted earlier, increasing the width $W_1$ of the latch transistor moat regions 12 would increase the overall performance of the sense amplifiers 11 and 13. However, the pitch P is typically desired to be as small as possible to limit the size of the memory array. The pitch P is, therefore, typically a set parameter and is defined relative to the bit line pitch. With the conventional sense amplifiers 11 and 13 of FIGS. 2 and 3, the sensing capability of the sense amplifiers 11 and 13, is limited because the latch transistor width $W_1$ cannot be increased due to the defined pitch P and the minimum gate width, gate to moat spacing and gate to gate spacing requirements.

Figure 4:
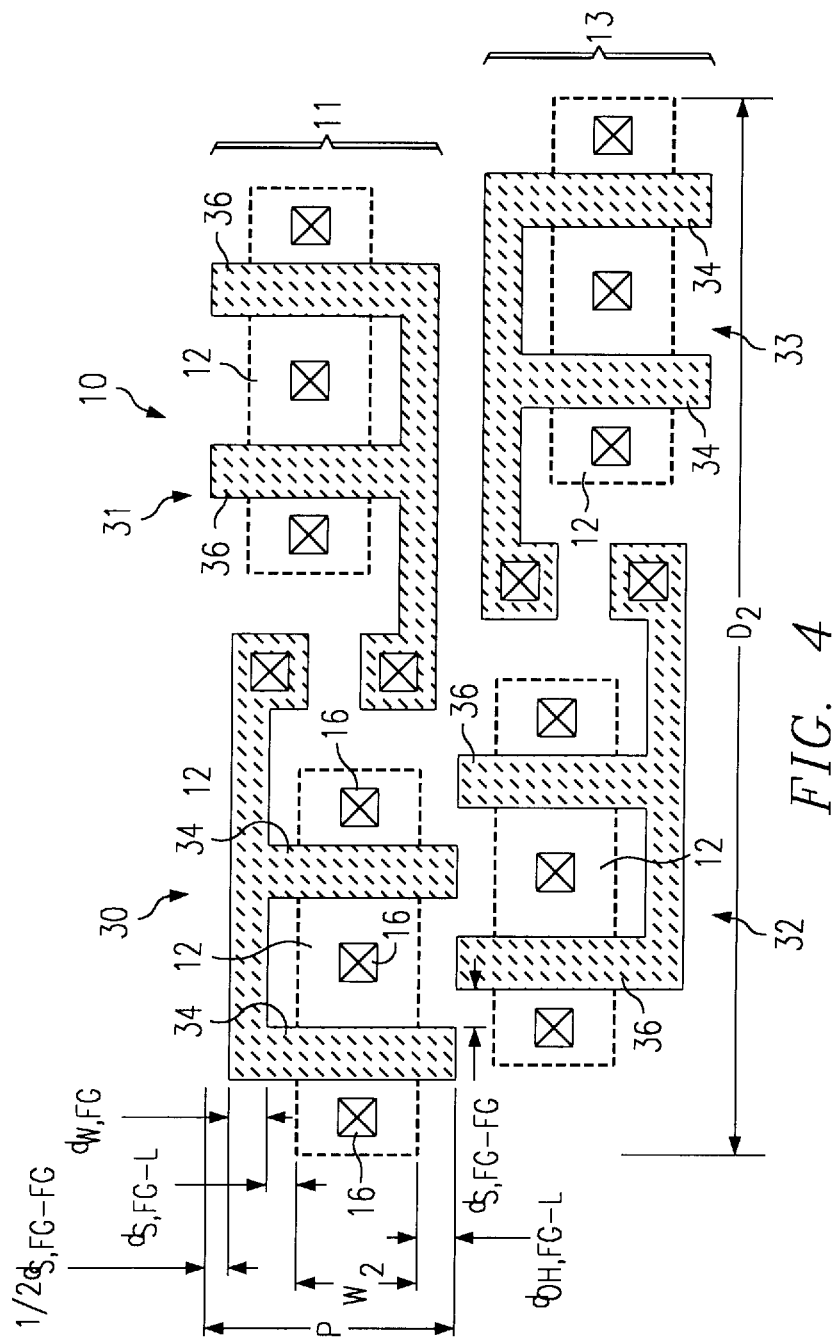
FIG. 4 shows one embodiment of a layout of the moats, gates, and contacts of the latch transistors in two adjacent sense amplifiers according to the present invention.

FIG. 4 shows one embodiment of a layout of the moat regions 12, gate regions 14, and contacts 16 of latch transistors 30, 31, 32 and 33 according to the present invention. The latch transistor layout of the present invention results in sense amplifiers 11 and 13 with an increased latch transistor width $W_2$. The increased latch transistor width occurs by offsetting the latch transistor moat regions 12 relative to each other in both the horizontal and vertical directions as compared to the latch transistor moat regions 12 in FIG. 3. The offset of the latch transistor moat regions in both the horizontal and vertical directions is equal to the minimum gate to gate spacing ($d_{S, FG-FG}$). FIG. 4, like FIG. 3, shows the moat regions 12, gate regions 14, and contacts 16, while FIG. 5 adds the connections to the associated paired bit lines.

Figure 5:
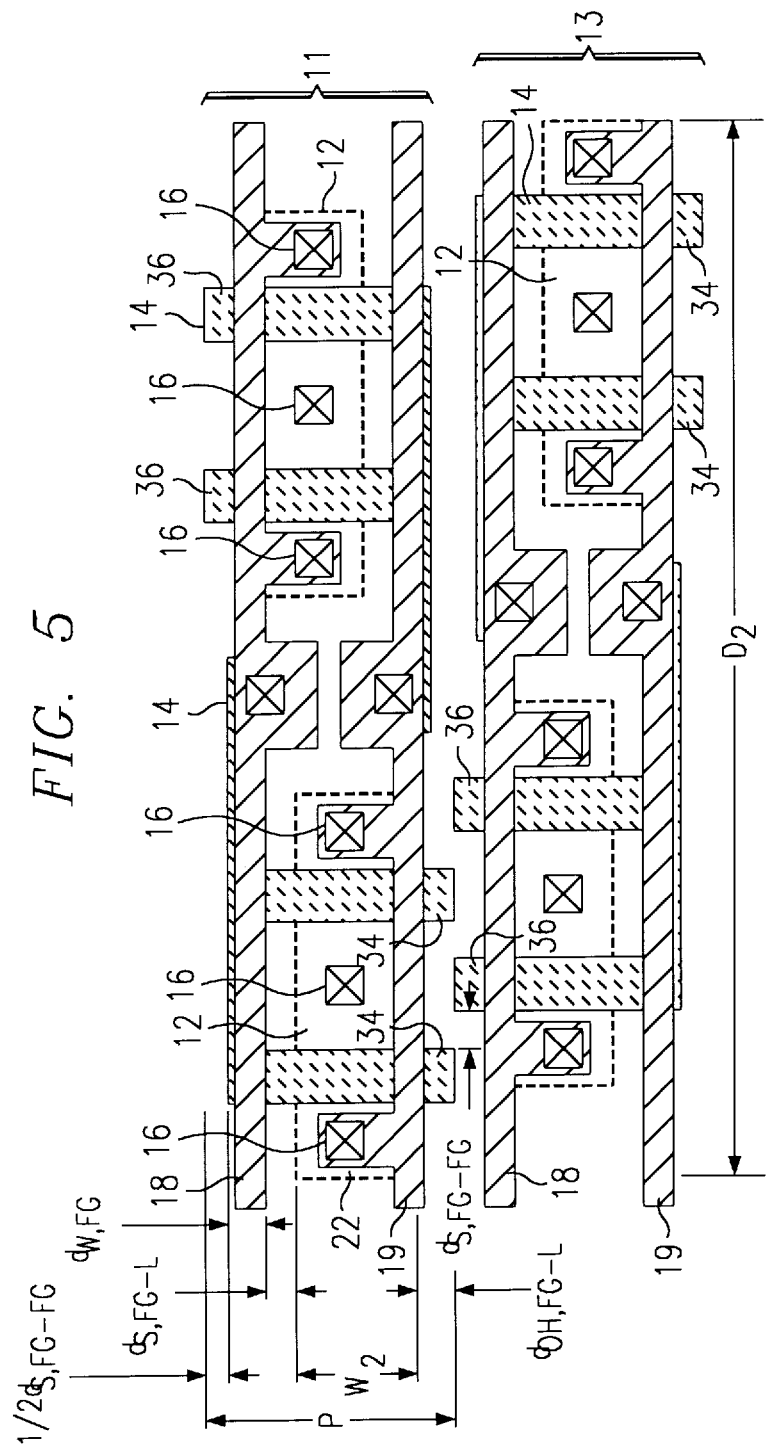
FIG. 5 shows one embodiment of the sense amplifiers of FIG. 4 including connections to associated paired bit lines.

Positioning the latch transistor moat regions 12 as shown in FIGS. 4 and 5 allows interleaving of the gate fingers 34 of sense amplifier 11 with the gate fingers 36 of sense amplifier 13. FIG. 4 only shows two adjacent sense amplifiers 11 and 13 with gate fingers 34 interleaved with gate fingers 36, however, the gate fingers for each adjacent pair of sense amplifiers can be interleaved in a similar manner. Design requirements for the fabrication process of the minimum gate width ($d_{W, FG}$), the minimum gate to moat spacing ($d_{S, FG-L}$), and the minimum gate overhang of moat ($d_{OH, FG-L}$) are the same as in FIG. 3. The offsetting of the latch transistors 30, 31, 32 and 33 and interleaving of the gate fingers 34 with the gate fingers 36 eliminates the gate to gate spacing requirement in the vertical direction allowing the moat regions 12 to be wider. The minimum gate to gate spacing ($d_{S, FG-FG}$) is still met in the horizontal direction for the embodiment of FIG. 4. For the sense amplifiers 11 and 13 shown in FIG. 4, the latch transistor width $W_2$ is determined by:

$$W_2 = P - \frac{1}{2}d_{S, FG-FG} - d_{W, FG} - d_{S, FG-L} - d_{OH, FG-L}.$$

Subtracting the conventional latch transistor width $W_1$ from the latch transistor finger width $W_2$ of the present invention shows that $W_2$ is larger than $W_1$ by one half of the minimum gate to gate spacing requirement ($\frac{1}{2}d_{S, FG-FG}$). The width $W_2$ increases by one half the gate to gate spacing requirement, rather than the full gate to gate spacing requirement, because of the movement of the gate regions 14 in the vertical direction. For example, note how the right-most gate fingers 34 and 36 of FIG. 4 extend higher and lower, respectively, than their counterparts in FIG. 3. The wider transistor moat regions 12 results in improved sensing speed and improved performance for the sense amplifiers 11 and 13.

In the embodiment illustrated in FIGS. 4 and 5, the resulting gain in latch transistor width comes with a price of increasing the overall sense amplifier length in the horizontal direction. The conventional sense amplifiers 11 and 13 of FIG. 3 have an overall length of $D_1$ for the two shown latch transistors, while the sense amplifiers 11 and 13 of the present invention have an overall length of $D_2$, as shown in FIG. 4. Because $D_2$ is greater than $D_1$, using the sense amplifier layout shown in FIGS. 4 and 5 will increase the horizontal area consumed by the sense amplifiers and can increase the overall size of the memory array. Thus, for the embodiment of FIGS. 4 and 5, the present invention provides an area versus performance tradeoff that provides an increased sensing performance at the cost of an increased sense amplifier length for a given pitch. It should be understood that other implementations of the present invention could increase the latch transistor width without the same increase in horizontal length depending upon different layout choices and design requirements.

FIG. 5 shows the sense amplifiers of FIG. 4 including connections to paired associated bit lines. FIG. 5 shows the moat regions 12 under the gate regions 14 covered by the paired bit lines 18 and 19. The contacts 16 connect the latch transistors 30, 31, 32 and 33 to the paired bit lines, as shown. FIG. 5 again illustrates offset latch transistors 30, 31, 32 and 33 and the interleaving of gate fingers 34 with gate fingers 36 to provide wider latch transistor moats 12.

The present invention provides a semiconductor memory device having sense amplifiers where the latch transistor moat region width is increased for the same sense transistor pitch. Each sense amplifier comprises latch transistors having a moat region and a gate region comprising a plurality of gate fingers where the length of the gate fingers is substantially equal to the pitch of the sense amplifier. Adjacent latch transistors are offset from one another in both the horizontal and vertical directions and the gate fingers of those latch transistors are interleaved such that the latch transistors have wider moat regions while maintaining the sense amplifier latch transistor pitch. The present invention provides a sense amplifier latch transistor with a wider latch transistor 22 that increases the performance of the device within a given pitch.

Although the present invention has been described in detail, it should be understood that various changes, substitutions and alterations can be made hereto without departing from the spirit and scope of the invention as described by the appended claims.

What is claimed is:

1. A semiconductor memory device having sense amplifiers associated with a paired bit line, comprising:

a plurality of sense amplifiers, each sense amplifier comprising latch transistors, and each latch transistor having:

a moat region; and a gate region comprising a plurality of gate fingers, the length of the gate fingers determined by the pitch of the sense amplifier;

wherein latch transistors of adjacent sense amplifiers are offset from one another in both the horizontal and vertical directions and the gate fingers of those latch transistors are interleaved such that the latch transistors have wider moat regions while maintaining the sense amplifier latch transistor pitch.

2. The device of claim 1, wherein the offset of the latch transistors relative one another is equal to the minimum gate to gate spacing in both the horizontal and vertical directions.

3. The device of claim 1, wherein the plurality of sense amplifiers comprise a plurality of adjacently aligned rows of sense amplifiers.

4. The device of claim 3, wherein the plurality of gate fingers in each row of sense amplifiers are interleaved with the plurality of gate fingers of sense amplifiers in each adjacent row of sense amplifiers to provide a wider latch transistor while maintaining the sense amplifier latch transistor pitch.

5. The device of claim 4, wherein the gate fingers of each row of sense amplifiers are offset horizontally from the gate fingers of each adjacent row of sense amplifiers by the minimum required gate to gate spacing, and are offset vertically from the latch transistors of each adjacent row of sense amplifiers by the minimum required gate to latch transistor overhang.

6. The device of claim 1, wherein the width of the latch transistor W is defined by:

$$W = P - \tfrac{1}{2} d_{S,\ FG\text{-}FG} - d_{W,\ FG} - d_{S,\ FG\text{-}L} - d_{OH,\ FG\text{-}L}$$

where P is the pitch of the sense amplifier latch transistor, $d_{W,\ FG}$ is the minimum gate width, $d_{S,\ FG\text{-}L}$ is the minimum gate to moat spacing, $d_{OH,\ FG\text{-}L}$ is the minimum gate overhang of moat, and $d_{S,\ FG\text{-}FG}$ is the minimum gate to gate spacing.

7. The device of claim 6, wherein the pitch, the minimum gate width, the minimum gate to moat spacing, the minimum gate overhang of moat, and the minimum gate to gate spacing are defined design criteria for the semiconductor memory device.

8. The device of claim 1, wherein each sense amplifier comprises a pair of latch transistors, and wherein each gate region comprises a pair of gate fingers.

9. The device of claim 8, wherein the pair of latch transistors comprise an N-channel latch transistor and a P-channel latch transistor.

10. A method of forming a plurality of latch transistors in an array of sense amplifier latch transistors in a semiconductor memory device to increase the width of the latch transistors for a given pitch of the sense amplifier latch transistor, the method comprising:

forming a plurality of sense amplifiers on a substrate, each sense amplifier comprising latch transistors having a moat region and a gate region, each gate region have a plurality of gate fingers; and positioning each latch transistor so that adjacent latch transistors are offset from one another in both the horizontal and vertical directions to provide a wider latch transistor moat region while maintaining the pitch of the sense amplifier latch transistor.

11. The method of claim 10, wherein offsetting adjacent latch transistors further comprises offsetting adjacent latch transistors a distance equal to the minimum gate to gate spacing in both the horizontal and vertical directions.

12. The method of claim 10 further comprising:

aligning the plurality of sense amplifiers in a plurality of adjacent rows of sense amplifiers; and interleaving the plurality of gate fingers of each row of sense amplifiers with the plurality of gate fingers of sense amplifiers in each adjacent row to maximize the width of each latch transistor while maintaining the pitch.

13. The method of claim 12, wherein interleaving the gate fingers further comprises horizontally offsetting the gate fingers in adjacent rows of sense amplifiers by the minimum required gate to gate spacing.

14. The method of claim 13, wherein interleaving the gate fingers further comprises vertically offsetting the gate fingers in each row of sense amplifiers from the latch transistors of each adjacent row of sense amplifiers by the minimum required gate to latch transistor overhang.

15. The method of claim 10 further comprising, forming each latch transistor to reduce the latch transistor width while maintaining the pitch of the sense amplifier, wherein the width of the latch transistor W is defined by:

$$W = P - \tfrac{1}{2} d_{S,\ FG\text{-}FG} - d_{W,\ FG} - d_{S,\ FG\text{-}L} - d_{OH,\ FG\text{-}L}$$

where P is the pitch of the sense amplifier latch transistor, $d_{W,\ FG}$ is the minimum gate width, $d_{S,\ FG\text{-}L}$ is the minimum gate to moat spacing, $d_{OH,\ FG\text{-}L}$ is the minimum gate overhang of moat, and $d_{S,\ FG\text{-}FG}$ is the minimum gate to gate spacing.

16. The method of claim 15, wherein the pitch, the minimum gate width, the minimum gate to moat spacing, the minimum gate overhang of moat, and the minimum gate to gate spacing are defined design criteria for the semiconductor memory device.

17. The method of claim 10, wherein each sense amplifier is formed to comprise a pair of latch transistors, and wherein each gate region is formed to comprise a pair of gate fingers.

18. The method of claim 17, wherein the pair of latch transistors is formed to comprise an N-channel latch transistor and a P-channel latch transistor.

19. A semiconductor memory device having a plurality of rows of sense amplifiers, each row associated with a paired bit line, comprising:

a plurality of adjacent sense amplifiers, each sense amplifier comprising a pair of latch transistors, and each latch transistor having:
   a moat region; and
   a gate region comprising a pair of gate fingers, the length of the gate fingers determined by the pitch of the sense amplifier;

wherein latch transistors of adjacent sense amplifiers are offset from one another in both the horizontal and vertical directions by the minimum gate to gate spacing, and wherein the gate fingers of each row of sense amplifiers are offset horizontally from the gate fingers of each adjacent row of sense amplifiers by the minimum required gate to gate spacing, and are offset vertically from the latch transistors of each adjacent row of sense amplifiers by the minimum required gate to latch transistor overhang, such that the latch transistors have wider moat regions while maintaining the sense amplifier latch transistor pitch; and wherein the width of the latch transistor W is defined by:

$$W = P - \tfrac{1}{2} d_{S,\ FG\text{-}FG} - d_{W,\ FG} - d_{S,\ FG\text{-}L} - d_{OH,\ FG\text{-}L}$$

where P is the pitch of the sense amplifier latch transistor, $d_{W,\ FG}$ is the minimum gate width, $d_{S,\ FG\text{-}L}$ is the minimum gate to moat spacing, $d_{OH,\ FG\text{-}L}$ is the minimum gate overhang of moat, and $d_{S,\ FG\text{-}FG}$ is the minimum gate to gate spacing, and wherein the pitch, the minimum gate width, the minimum gate to moat spacing, the minimum gate overhang of moat, and the minimum gate to gate spacing are defined design criteria for the semiconductor memory device.

20. The device of claim 19, wherein the pair of latch transistors comprise an N-channel latch transistor and a P-channel latch transistor.

\* \* \* \* \*